(12) United States Patent
Buyuktosunoglu et al.

(10) Patent No.: US 7,170,772 B1
(45) Date of Patent: Jan. 30, 2007

(54) APPARATUS AND METHOD FOR DYNAMIC CONTROL OF DOUBLE GATE DEVICES

(75) Inventors: Alper Buyuktosunoglu, White Plains, NY (US); Omer Dokumaci, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,321

(22) Filed: Jul. 29, 2005

(51) Int. Cl.
*G11C 11/00* (2006.01)
*H03K 17/687* (2006.01)

(52) U.S. Cl. ...................................... 365/129; 327/434
(58) Field of Classification Search ................ 365/129; 327/434, 313
See application file for complete search history.

(56) References Cited

U.S. PATENT DOCUMENTS

| | | | |
|---|---|---|---|
| 6,413,802 B1 | 7/2002 | Hu et al. | |
| 6,433,609 B1 * | 8/2002 | Voldman | 327/313 |
| 6,462,611 B2 | 10/2002 | Shigehara et al. | |
| 6,492,212 B1 | 12/2002 | Ieong et al. | |
| 6,580,293 B1 * | 6/2003 | Bernstein et al. | 326/95 |
| 6,603,453 B2 | 8/2003 | Yamazaki et al. | |
| 6,750,487 B2 | 6/2004 | Fried et al. | |
| 6,989,706 B2 * | 1/2006 | Sekigawa et al. | 327/434 |
| 2003/0141525 A1 | 7/2003 | Nowak | |
| 2003/0193065 A1 | 10/2003 | Fried et al. | |
| 2004/0056305 A1 | 3/2004 | Segura et al. | |
| 2004/0075122 A1 | 4/2004 | Lin et al. | |
| 2004/0080481 A1 | 4/2004 | Yamazaki et al. | |
| 2004/0161898 A1 | 8/2004 | Fried et al. | |

* cited by examiner

*Primary Examiner*—Anh Phung
(74) *Attorney, Agent, or Firm*—Cantor Colburn LLP

(57) ABSTRACT

An apparatus for implementing dynamic control of a double gate semiconductor device includes a first switch configured to selectively couple a first gate input of the double gate device to a second gate input of the double gate device, and a second switch configured to selectively couple the second gate input of the double gate device to a selected voltage so as to adjust the threshold voltage of the double gate device.

20 Claims, 3 Drawing Sheets

APPARATUS AND METHOD FOR DYNAMIC CONTROL OF DOUBLE GATE DEVICES

BACKGROUND

The present invention relates generally to integrated circuit devices, and, more particularly, to an apparatus and method for implementing dynamic control of double gate devices.

Complementary metal-oxide-semiconductor (CMOS) technology is the predominant semiconductor technology used for the manufacture of ultra-large scale integrated (ULSI) circuits today. Performance enhancement between generations of devices is generally achieved by reducing the size of the device, resulting in an enhancement in device speed. This is generally referred to as device "scaling." As conventional MOSFETs are scaled to channel lengths below 100 nm, certain problems arise. In particular, interactions between the source and drain of the MOSFET degrade the ability of the gate to control whether the device is on or off. This phenomenon is also referred to as a "short channel effect."

Silicon-on-insulator (SOI) MOSFETs are formed with an insulator (typically, but not limited to, silicon dioxide) below the device active region, as opposed to conventional bulk MOSFETs, which are formed directly on silicon substrates, and hence have silicon below the active region. SOI is advantageous in one respect since it reduces unwanted coupling between the source and the drain of the MOSFET through the region below the channel. However, as device size is scaled even further, this approach also becomes increasingly difficult, since the distance between the source and drain is further reduced, leading to reduced gate control and increased short channel effects.

More recently, double gate devices have emerged as an alternative to conventional single gate CMOS devices for substantially increasing device performance. One specific type of double gate device is what is referred to as a "FinFET," which includes a channel formed in a vertical fin that is controlled by a self-aligned double gate. The fin may be made thin enough such that the two gates can together control the entire fully depleted channel. Although it is a double gate structure, the FinFET is similar to existing planar MOSFET with respect to layout and fabrication techniques. Thus, a FinFET provides a range of channel lengths, CMOS compatibility, and large packing density compared to other double gate structures.

Notwithstanding the advantages of such newer types of device structures, power consumption still remains as one of the limiting factors in the overall chip design. For example, the scaling down of threshold voltage and gate oxide thickness results in a rapid increase in the amount of standby (leakage) power consumed. However, the critical dimensions of the devices fabrication processes have scaled faster than the ability to control parameters such as static power consumption. Accordingly, the constant search for new device structures, coupled with the difficulty in controlling device parameters, has resulted in significant variations across a semiconductor device. This variability in turn makes it more difficult to verify the power consumption, timing and functionality of a design before it can be implemented and manufactured.

In the case of single gate structures, threshold voltage control has been proposed through back-gate biasing to achieve high circuit performance during active periods, and low leakage current during idle periods by means of an extra gate. This technique also provides control through the back-gate body biasing to make devices more robust against design variations. In addition, it is well known that the threshold voltage of a single gate, SOI transistor threshold voltage may be dynamically changed by applying a voltage to a backgate located below the BOX (buried oxide) layer. However, there is presently no known method or structure for dynamically altering the threshold voltage of a double gate device such as a FinFET transistor.

In a FinFET, the first and second gates may be operated independently with respect to one other. Thus, one gate could be used for the control signal while the other gate is used to adjust the threshold voltage. In this case, however, the FinFET is essentially operating in a single gate mode with a backgate attached thereto. The problem therefore lies in configuring a device that may be maintained in the double gate mode of operation (i.e., the first and second gates connected to each other) when maximum device speed is desired, but that also has the capability of having its threshold voltage adjusted when low power operation and mitigation of design variations are desired.

SUMMARY

The foregoing discussed drawbacks and deficiencies of the prior art are overcome or alleviated by an apparatus for implementing dynamic control of a double gate semiconductor device. In an exemplary embodiment, the apparatus includes a first switch configured to selectively couple a first gate input of the double gate device to a second gate input of the double gate device, and a second switch configured to selectively couple the second gate input of the double gate device to a selected voltage so as to adjust the threshold voltage of the double gate device.

In another embodiment, a method for implementing dynamic control of a double gate semiconductor device includes configuring a first switch for selectively coupling a first gate input of the double gate device to a second gate input of the double gate device, and configuring a second switch for selectively coupling the second gate input of the double gate device to a selected voltage so as to adjust the threshold voltage of the double gate device.

In still another embodiment, an apparatus for implementing dynamic control of a plurality of double gate semiconductor devices includes a first plurality of switches configured to selectively couple a first gate input of a corresponding double gate device to a second gate input thereof, and a second switch configured to selectively couple the second gate input of each of the plurality of double gate devices to a selected voltage so as to adjust the threshold voltage of the double gate devices.

BRIEF DESCRIPTION OF THE DRAWINGS

Referring to the exemplary drawings wherein like elements are numbered alike in the several Figures.

DETAILED DESCRIPTION

Disclosed herein is an apparatus and method for dynamically controlling a double gate device by selectively switching the double gate device between a double gate mode of operation (normal operation) and a backgate bias mode (standby, low power mode). In an exemplary embodiment, the double gate devices include finFET architectures such that realization of the dynamic switching does not result in additional complexity to the fabrication process, nor is a new device design needed for the double gate devices.

Briefly stated, the present embodiments provide a control structure for double gate devices that maintains the double gate operation when maximum speed is desired, and that adjusts the threshold voltage of the double gate device when low power operation or mitigation of design variations is desired. To this end, the present disclosure introduces a pair of control switches connected to gate inputs of a double gate device. More specifically, a first switch is configured to selectively connect to both gate inputs of the double gate device together, while a second switch is configured to selectively connect one of the gate inputs to a (variable) biasing voltage.

In a normal operation mode, the first switch connects both gate inputs of the double gate device to one another for achieving maximum speed. Simultaneously, the second switch isolates the double gate device from the biasing voltage. When low power operation and/or mitigation of design variability are desired, the first switch is turned off and the second switch is on. This results in one of the gate terminals of the double gate device to be coupled to the biasing voltage that changes the threshold voltage of device, thus achieving the requirements of low power operation.

Figure 1:
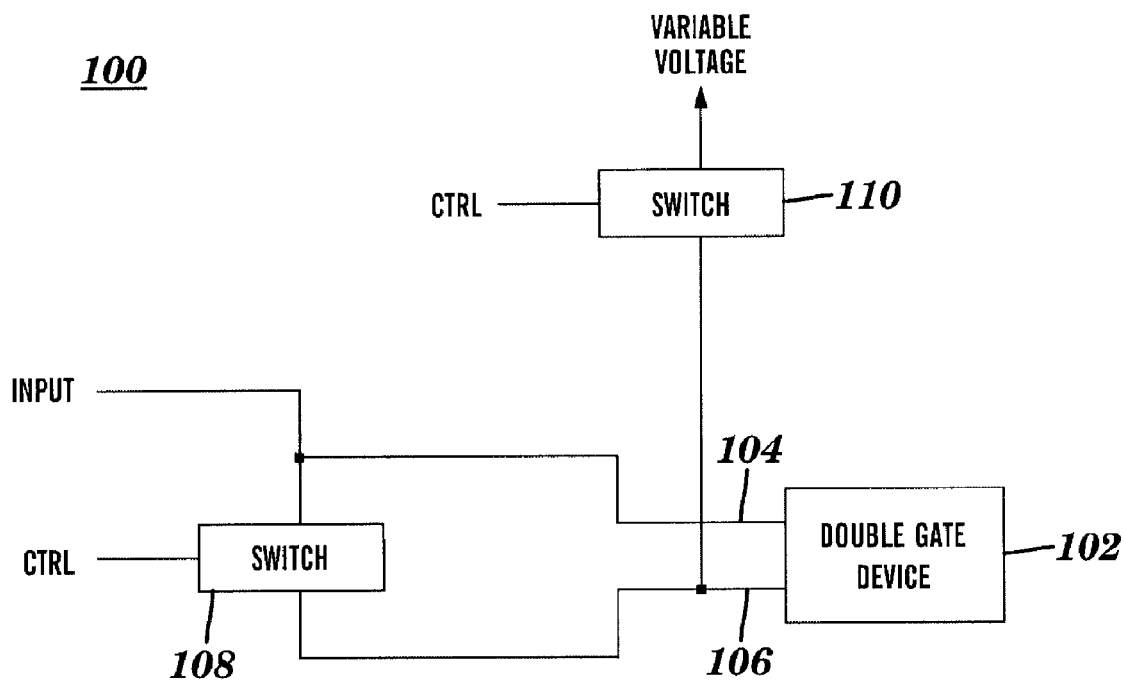
FIG. 1 is a schematic block diagram of an apparatus for dynamically controlling a double gate device, in accordance with an embodiment of the invention.

FIG. 1 is a schematic block diagram illustrating an apparatus 100 for dynamically controlling the operation of a double gate device, in accordance with an embodiment of the invention. As is shown, a double gate device 102 (e.g., a finFET) includes first and second gate inputs 104 and 106. A first switch 108, through a control signal CTRL selectively couples the gate inputs 104 and 106 together in a normal mode of operation for maximum speed. In other words, the input signal ("input") to the double gate device is coupled to both the first and second gate inputs 104 and 106 in a normal operation mode. At the same time, the control signal CTRL deactivates a second switch 110 such that the second gate input 106 of the double gate device is not coupled to the variable biasing voltage.

In contrast, for low power operation and/or mitigation of design variability, the first switch 108 is deactivated while the second switch 110 is activated through the control signal CTRL. This results in the isolation of the first and second gate inputs 104, 106, with respect to one another. The input signal is coupled only to the first gate input 104, while the variable voltage is now coupled to the second gate input 106 so as to alter the voltage threshold of the double gate device 102.

In general, the switching control signal CTRL may be set high or low under several conditions, depending on the polarity of the double gate device 102 and switches 108, 110. During a sleep mode when the logic blocks are deemed to be idle for a certain period of time, the second gate input 106 for the double gate device 102 may be pulled high/low (PMOS/NMOS) to reduce leakage power as the voltage change on the second gate input 106 can be used to change the threshold voltage of the device 102. After manufacturing process if the circuit is not operational due to design variations, the control can be used as a proxy to overcome the threshold voltage variations by providing appropriate voltage values to the other gate input, thus making the device operational. Note that the voltage supplied through switch 110 can be a variable.

Figure 2:
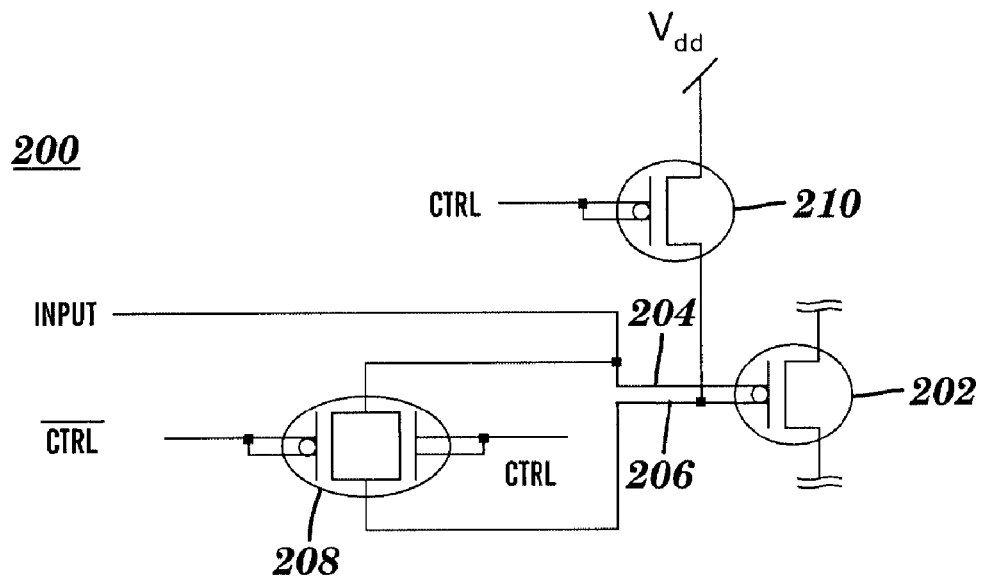
FIG. 2 is a schematic diagram of an exemplary implementation of the apparatus of FIG. 1, wherein the double gate device is p-type.

FIG. 2 illustrates a more specific embodiment of an apparatus 200 in which the double gate device 202 is implemented in the form of a PMOS device controlled through a first gate input 204 and a second gate input 206. Both the first and second gate inputs are in communication with a first switch 208 that, when activated, serves as a transmission gate. The transmission gate may be implemented, for example, by connecting the drain and source terminals of NMOS and PMOS double gate devices, such as shown in FIG. 2. However, it will be appreciated by those skilled in art that the first switch 208 may also be implemented through single gate NMOS/PMOS devices. As also illustrated, the second control switch 210 is embodied by a double gate PMOS device that is connected to a system voltage supply ($V_{dd}$).

In the case where double gate devices are used for the first and second control switches 208, 210, the gate inputs thereof are shorted together. When the value of CTRL is high the first control switch 208 is rendered conductive, thus coupling first and second gate inputs 204 and 206 to one another to achieve maximum device speed. Concurrently, the second switch 210 (being p-type) is turned off, which isolates the second gate input 206 from $V_{dd}$. On the other hand, when CTRL is low, the first switch 208 is rendered nonconductive, leaving first and second gate inputs 204 and 206 isolated from one another. Furthermore, second switch 210 is turned on, thereby pulling the second the gate input 206 of double gate device 202 up to $V_{dd}$, and changing the threshold voltage of double gate device 202.

Figure 3:
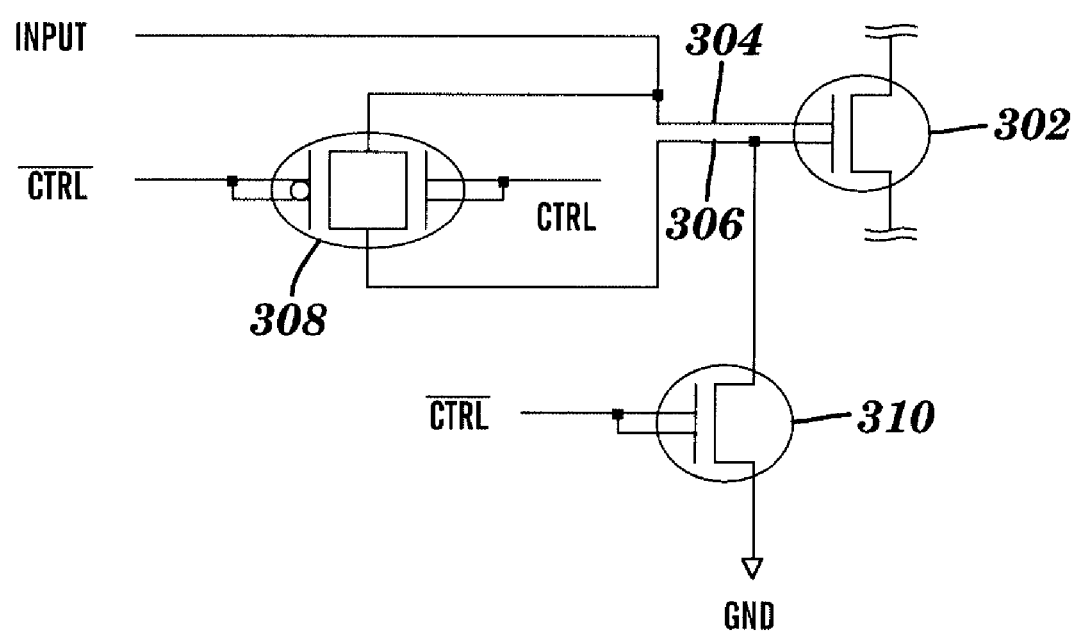
FIG. 3 is a schematic diagram of another exemplary implementation of the apparatus of FIG. 1, wherein the double gate device is n-type.

Similar to the embodiment of FIG. 2, FIG. 3 illustrates a more specific embodiment of an apparatus 300 in which the double gate device 302 is implemented in the form of an NMOS device controlled through a first gate input 304 and a second gate input 306. Once again, both the first and second gate inputs 304, 306 are in communication with a first switch 308 that, when activated, serves as a transmission gate. The embodiment of FIG. 3 also illustrates connected the drain and source terminals of NMOS and PMOS double gate devices, but again it will be appreciated by those skilled in art that the first switch 308 may also be implemented through single gate NMOS/PMOS devices. However, in contrast to the embodiment of FIG. 2, the second control switch 310 in FIG. 3 is embodied by a double gate NMOS device that is connected to ground.

Where double gate devices are used for the first and second control switches 308, 310, the gate inputs thereof are shorted together. When the value of CTRL is high the first control switch 308 is rendered conductive, thus coupling first and second gate inputs 304 and 306 to one another to achieve maximum device speed. Concurrently, the second switch 310 (being n-type) is turned off (since it receives the inverted value of CTRL), thus isolates the second gate input 306 from ground. On the other hand, when CTRL is low, the first switch 308 is rendered nonconductive, leaving first and second gate inputs 304 and 306 isolated from one another. Furthermore, the second switch 310 is turned on, thereby pulling the second the gate input 306 of double gate device 302 down to ground, and changing the threshold voltage of double gate device 302.

Figure 4:
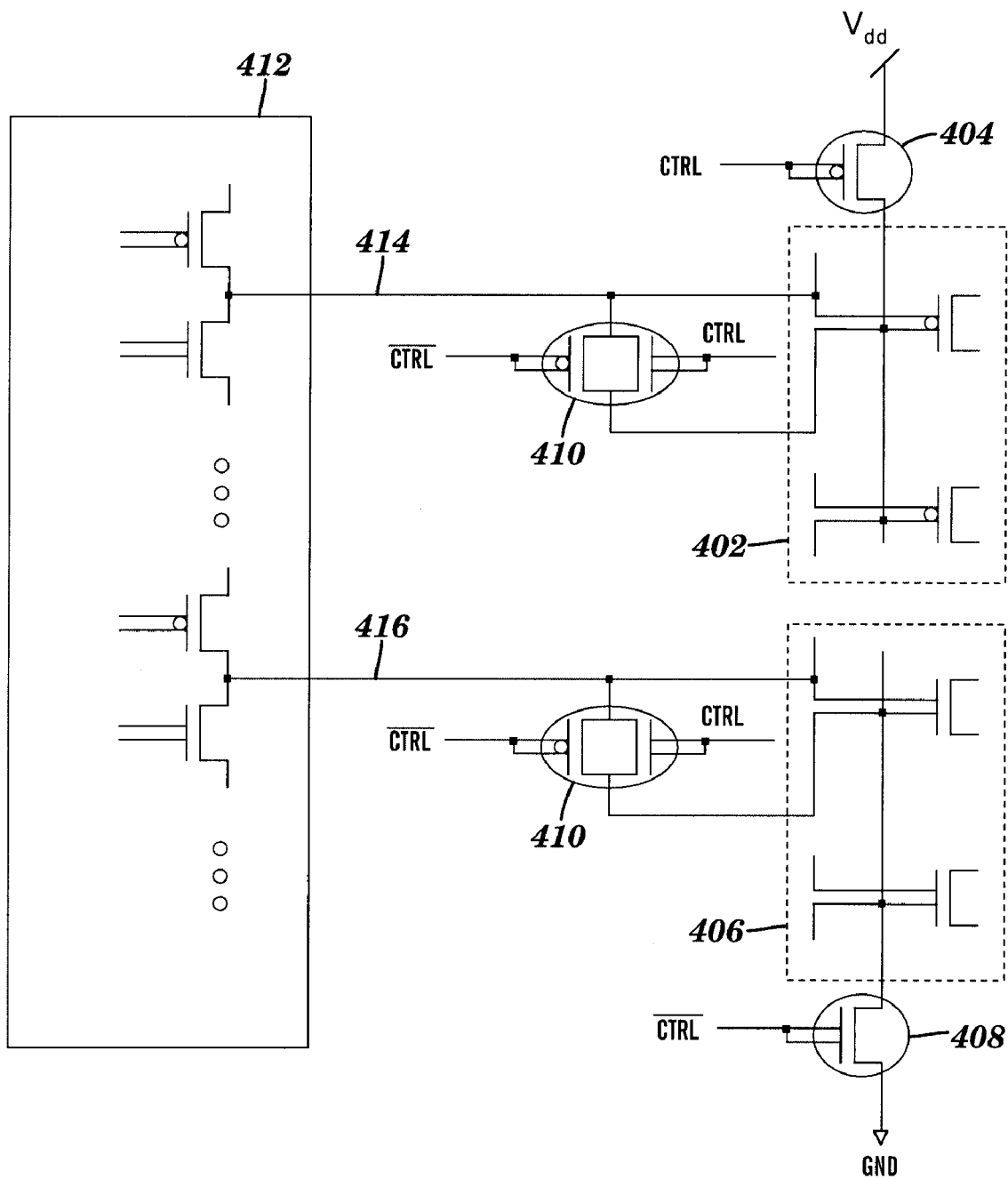
FIG. 4 is a schematic diagram of an apparatus for implementing dynamic control of double gate devices, in accordance with a further embodiment of the invention.

Finally, FIG. 4 illustrates a more detailed embodiment of an apparatus 400 for implementing dynamic control of double gate devices, in which a first plurality 402 of (p-type) double gate devices share a single pull up switch 404, and a second plurality 406 of (n-type) double gate devices 406 share a single pull down switch 408. However, each of the individual double gate devices in the PMOS block 402 and the NMOS block are configured with a corresponding switch 410 for selectively shorting the first and second gate terminals thereto. Also shown in FIG. 4 for illustrative purposes is a preceding logic block 412 that includes, for example, a plurality of double gate inverters. Thus, as shown, a first output 414 from the preceding logic block 412 represents the input signal to one gate of a first of the PMOS double gate devices of PMOS block 402. The output signal 414 is also coupled to the corresponding control switch 410 such that the signal 414 is also applied to the second gate of the PMOS device during a high speed mode when the value of CTRL is high. Similarly, a second output 416 from the preceding logic block 412 represents the input signal to one gate of a first of the NMOS double gate devices of NMOS block 402. The output signal 416 is also coupled to the corresponding switch control 410 such that the signal 416 is also applied to the second gate of the NMOS device during the high speed mode when the value of CTRL is high (and CTRL bar is low). When CTRL is low, each of the passgate switches 410 are shut off, PMOS device 404 and NMOS device 408 are conductive, and all of the double gate devices in blocks 402 and 406 are operating in the low power and/or mitigation of design variability mode.

The approach presented in the embodiments described herein implement an extra transmission (or single) gate for each double gate device to act as a switch. As this design translates into extra area overhead and power consumption, the dynamic control can therefore be selectively applied to certain portions of a circuit design deemed to be critical for controlling design variations and power consumption. Accordingly, the control switches may be implemented as high threshold devices in order to reduce the power overhead. However, as will be appreciated, through the use of the present apparatus and methodology, the advantages of a back-gate body biasing scheme (whether for sleep conditions and/or other special circumstances) may be realized. Moreover, for a normal operation mode, the present approach also has the added flexibility to run much faster in comparison to a conventional back gate body bias scheme that is not selectively disengaged.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for implementing dynamic control of a double gate semiconductor device, comprising:
   a first switch configured to selectively couple a first gate input of the double gate device to a second gate input of the double gate device; and
   a second switch configured to selectively couple said second gate input of the double gate device to a selected voltage so as to adjust the threshold voltage of the double gate device.

2. The apparatus of claim 1, wherein said double gate device further comprises a finFET.

3. The apparatus of claim 1, wherein for a first mode of operation, said first switch is configured to be conductive while said second switch is configured to be nonconductive, and for a second mode of operation, said first switch is configured to be nonconductive while said second switch is configured to be conductive.

4. The apparatus of claim 3, wherein an input signal to the double gate device is coupled to said first switch.

5. The apparatus of claim 3, wherein:
   the double gate device is p-type;
   said second switch is p-type; and
   said selected voltage comprises a circuit supply voltage, $V_{dd}$.

6. The apparatus of claim 3, wherein:
   the double gate device is n-type; and
   said second switch is n-type; and
   said selected voltage is ground.

7. The apparatus of claim 3, wherein said first and said second switches are also implemented as double gate devices.

8. The apparatus of claim 7, wherein said first switch is implemented as a PMOS device and an NMOS device having respective source terminals thereof connected to one another, and having respective drain terminals thereof connected to one another.

9. The apparatus of claim 5, wherein a logic high value of a control signal is used to render said first switch conductive and said second switch conductive.

10. The apparatus of claim 6, wherein a logic high value of a control signal is used to render said first switch conductive and said second switch nonconductive.

11. A method for implementing dynamic control of a double gate semiconductor device, the method comprising:
    configuring a first switch for selectively coupling a first gate input of the double gate device to a second gate input of the double gate device; and
    configuring a second switch for selectively coupling said second gate input of the double gate device to a selected voltage so as to adjust the threshold voltage of the double gate device.

12. The method of claim 11, wherein said double gate device further comprises a finFET.

13. The method of claim 11, wherein for a first mode of operation, said first switch is configured to be conductive while said second switch is configured to be nonconductive, and for a second mode of operation, said first switch is configured to be nonconductive while said second switch is configured to be conductive.

14. The method of claim 13, wherein an input signal to the double gate device is coupled to said first switch.

15. The method of claim 13, wherein:
    the double gate device is p-type;
    said second switch is p-type; and
    said selected voltage comprises a circuit supply voltage, $V_{dd}$.

16. The method of claim 3, wherein:
    the double gate device is n-type; and
    said second switch is n-type; and
    said selected voltage is ground.

17. The method of claim 13, wherein said first and said second switches are also implemented as double gate devices.

18. An apparatus for implementing dynamic control of a plurality of double gate semiconductor devices, comprising:

a first plurality of switches configured to selectively couple a first gate input of a corresponding double gate device to a second gate input thereof; and a second switch configured to selectively couple said second gate input of each of the plurality of double gate devices to a selected voltage so as to adjust the threshold voltage of the double gate devices.

19. The apparatus of claim 18, wherein said double gate devices further comprise finFETs.

20. The apparatus of claim 18, wherein for a first mode of operation, said first plurality of switches is configured to be conductive while said second switch is configured to be nonconductive, and for a second mode of operation, said first plurality of switches is configured to be nonconductive while said second switch is configured to be conductive.

* * * * *